US010831944B1

(12) United States Patent
Giattina

(10) Patent No.: US 10,831,944 B1
(45) Date of Patent: Nov. 10, 2020

(54) SYSTEM AND METHOD TO FACILITATE THE DESIGN, MANUFACTURING AND CONSTRUCTION OF STRUCTURES

(71) Applicant: WEVR, LLC, Bessemer, AL (US)

(72) Inventor: Christopher A. Giattina, Birmingham, AL (US)

(73) Assignee: WEVR, LLC, Bessemer, AL (US)

( * ) Notice: Subject to any disclaimer, the term of this patent is extended or adjusted under 35 U.S.C. 154(b) by 0 days.

(21) Appl. No.: 16/397,396

(22) Filed: Apr. 29, 2019

Related U.S. Application Data

(63) Continuation-in-part of application No. 15/248,194, filed on Aug. 26, 2016, now Pat. No. 10,275,544.

(60) Provisional application No. 62/210,684, filed on Aug. 27, 2015.

(51) Int. Cl.
*G06F 30/13* (2020.01)
*G06T 17/20* (2006.01)

(52) U.S. Cl.
CPC .............. *G06F 30/13* (2020.01); *G06T 17/20* (2013.01)

(58) Field of Classification Search
None
See application file for complete search history.

(56) References Cited

U.S. PATENT DOCUMENTS 9,562,632 B1 2/2017 Billman
2012/0303149 A1 11/2012 Bollendorf

*Primary Examiner* — Syed A Roni
(74) *Attorney, Agent, or Firm* — Brian T. Sattizahn; C. Brandon Browning; Maynard, Cooper & Gale, PC

(57) ABSTRACT

A system is provided that facilitates the building of a structure according to a project architectural design plan. The system provides standardized information to participants associated with a project based on the project design plan. The project architectural design plan can be compliant with one or more standards stored by the system. The project design plan can also incorporate information regarding products that are utilized in the project such as a plurality of prefabricated building modules. The requirements for a product are dictated by the standards established for the product and the project. Information about products used in the project can be embedded in links of the project architectural design plan.

17 Claims, 9 Drawing Sheets

US 10,831,944 B1

SYSTEM AND METHOD TO FACILITATE THE DESIGN, MANUFACTURING AND CONSTRUCTION OF STRUCTURES

CROSS-REFERENCE TO RELATED APPLICATIONS

This application is a continuation-in-part of U.S. patent application Ser. No. 15/248,194, filed on Aug. 26, 2016, titled "Design Standard Implementation System and Method," and granted as U.S. Pat. No. 10,275,544, which application claims priority to U.S. Provisional Application No. 62/210,684, filed on Aug. 27, 2015, and titled "Design Standard Implementation System and Method," and the entire contents of both applications are incorporated herein by reference.

BACKGROUND

The present disclosure generally pertains to a system and method to facilitate the design, manufacturing and construction of structures based on a design standards system. The design standards system may be used to instantly provide consistent standards to design, engineering, construction and other professionals to enable collaboration and commerce among the professionals during the design, manufacturing and construction of structures.

Prototypical designs are a widely employed tool utilized by serial builders, such as car, computer or building manufacturers. These types of manufacturers produce hundreds or even thousands of products each year. As a result, the manufacturers often use production systems to efficiently make the products in a cost-efficient manner. In general, prototypes are created at the program level and are applicable to all projects utilizing the program. The prototypes typically present design intent but are interpreted differently by local design teams. The projects may be assigned to various architects charged with developing design plans or documents that incorporate the program and are responsive to established design standards. The volume of projects, architects, contractors and site-specific conditions may contribute to variation at every project phase, such as planning, design, documentation and construction. Unnecessary variation increases costs in terms of both time and money. Further, many of the participants in a project team assembled to complete the project can be selected from local provider, which may increase cost and lower efficiency in completing the project if the skill level of the local providers is below that of other providers.

What is needed is an ecosystem based on a set of design standards which require no interpretation. Specifically, a system is needed that enables large, dispersed project teams working on different aspects of a project to collaborate and engage in commerce to complete the project.

DETAILED DESCRIPTION

As will be apparent to one skilled in the art, various modifications can be made within the scope of the aforesaid description. Such modifications being within the ability of one skilled in the art form a part of the present application and are embraced by the claims below.

The present disclosure generally pertains to a design standards system and method. In one embodiment, the design standards system is used to provide consistent standards and design plans instantly to design, engineering and construction professionals involved with a project such as the building of a structure. In such a system, a set of design standards are developed and curated at the project owner level so that the design standards may be efficiently applied at the project and product levels. The system utilizes remote servers and software networks that allow centralized data storage and online access to computer services or resources, i.e., "cloud computing".

In addition, the design standards system can support a larger ecosystem that permits different participants (e.g., design, engineering and construction professionals) to collaborate and engage in commerce to complete a project such as the building of the structure. The system supports collaboration by allowing the different participants to work together to create design plans and design standards for each aspect of a project. For example, project owners, project architects, project contractors, and manufacturers can access and share design plans and design standards via the system in order to define each aspect of a project from general principles (e.g., the structure is a wing of a building) down to specific details (e.g., location of an electrical outlet in a room of the structure). The establishing of design plans and design standards for every aspect of a project also enables the system to support the development and management of a supply chain for the project. Materials, components, assemblies and/or sub-assemblies needed for a project may be requested from other parties in the ecosystem by providing or sharing the information on the design plans and design standards with the participants that can potentially supply the necessary materials, components, assemblies and/or sub-assemblies. In addition to information sharing, the ecosystem encompasses and enables e-commerce between and among the participants for both goods and services (including labor and transportation).

Figure 1:
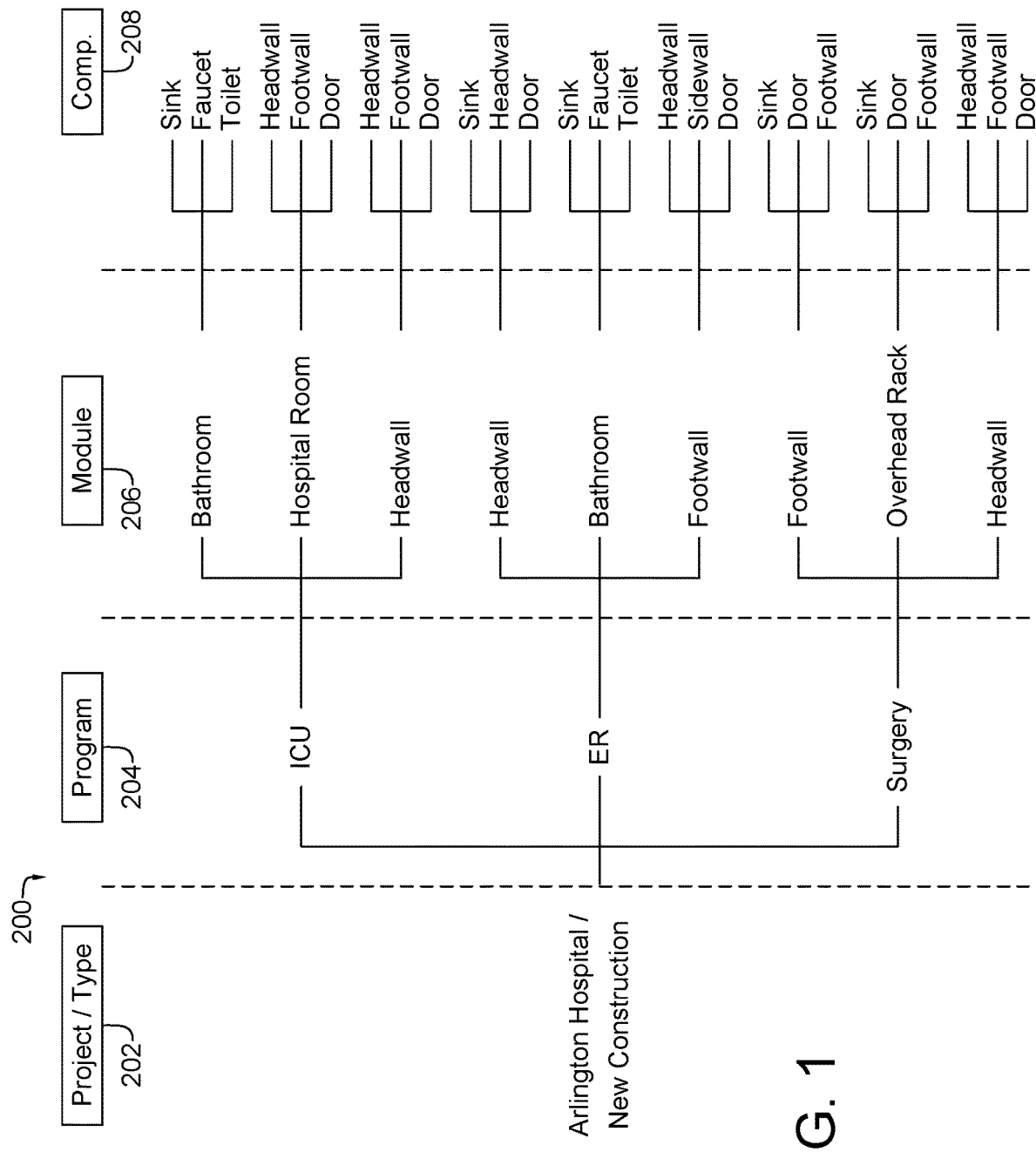
FIG. 1 is a chart illustrating the organization of a manufacturing project.

FIG. 1 depicts a chart illustrating the organization of a manufacturing project 200 as used in reference to presently described systems and methods. The project illustrated in FIG. 1 represents the construction of a hospital, although this type of organizational chart is applicable to other types of serial building endeavors which require multiple tasks. Referring again to FIG. 1, the building endeavor is most broadly classified as a project and/or project type 202. The project type 202 may include, for example, the name of the building under construction. In the embodiment illustrated in FIG. 1, the project 202 is the new construction of a hypothetical Arlington Hospital. In other non-limiting examples, the project type 202 may include a building renovation or repair. Next, the program classification 204 indicates the type of areas within the project 202 (i.e., the hospital), for instance an intensive care unit (ICU), emergency room (ER) or surgical area. Other types of program areas 204 are applicable in other embodiments for other projects 202. In some embodiments, the program or program classification 204 may be referred to as an assembly. The program classification 204 is further broken down into modules 206. As used herein, a module 206 is a completely prefabricated unit that may be inserted into the program 204 of the building construction. In some embodiments, the module 206 may be referred to as a sub-assembly. In one non-limiting embodiment, modules 206 may include a bathroom, hospital room, hospital room headwall, hospital room footwall, overhead rack, etc. The final classification includes the components 208 included in each module 206. In one non-limiting example, the components 208 of a bathroom module 206 may include a sink, a faucet and a toilet. One of skill in the art will understand that other projects 202, programs 204, modules 206 and components 208 are possible in other embodiments and that those listed in FIG. 1 are merely illustrative.

Figure 2:
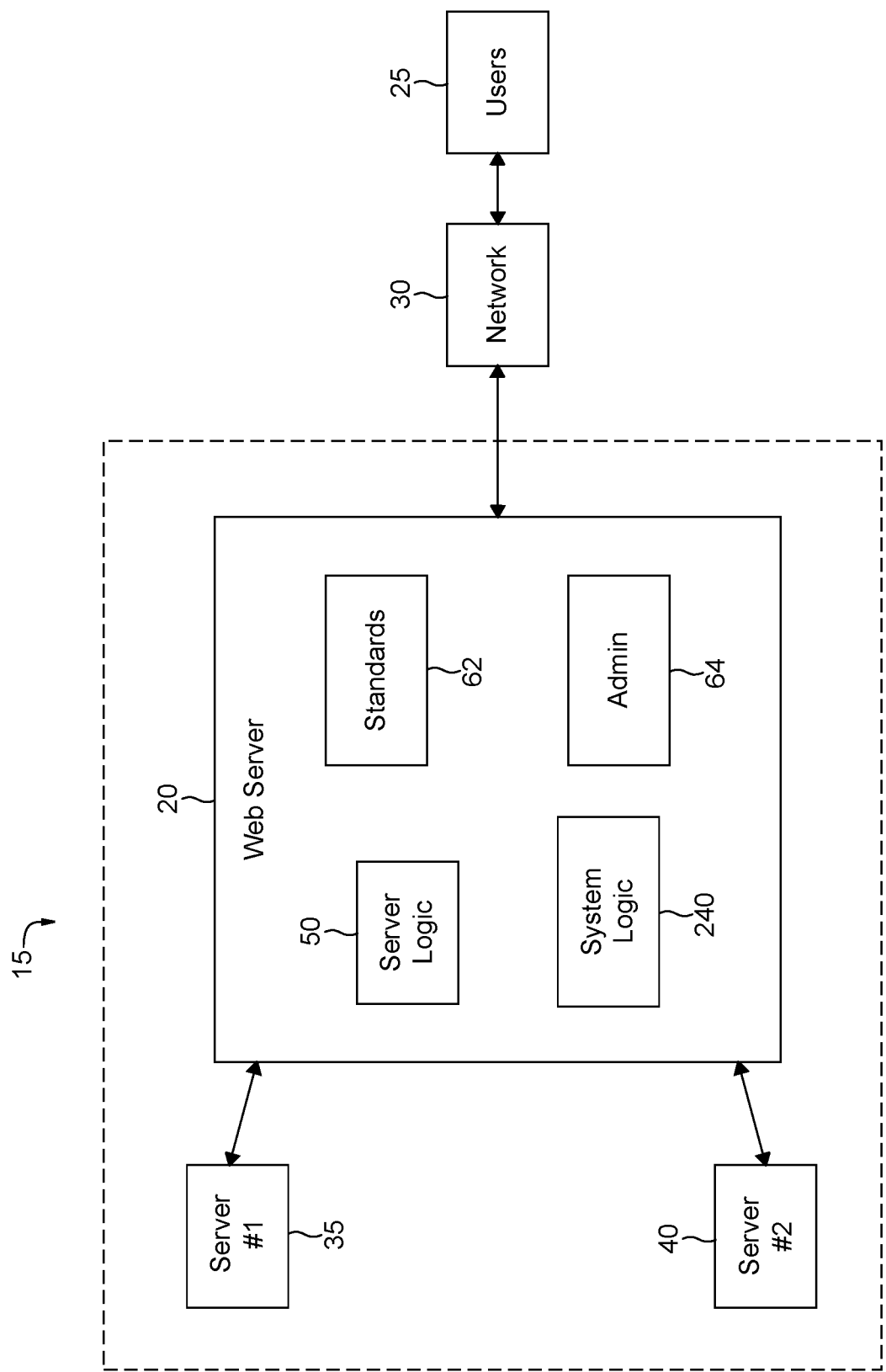
FIG. 2 is a block diagram illustrating an embodiment of a system for implementing design standards.

FIG. 2 depicts an embodiment of a system 15 for creating and maintaining design standards for serial manufacturing. In one embodiment, the system 15 may be utilized in the construction business, although other types of manufacturing businesses are possible in other embodiments. As shown by FIG. 2, system 15 includes a web server 20, which functions to store, process and deliver the web pages associated with system 15 to users 25 via a network 30 such as the Internet. Users 25 may include, for example, architects, engineers, contractors, builders, parts manufacturers and system administrators. System 15 also includes an additional first server 35 and second server 40 for storing design standards and architectural design plans and generating output files, as will be described in more detail hereafter. The web server 20, first server 35 and second server 40 operate as remote servers and software networks, allowing centralized data storage and online access to computer services or resources by all users 25. This collection of remote servers and software networks will be referred to herein as "the cloud" or as "cloud computing." In one embodiment, the web server 20, first server 35 and second server 40 may be hosted on a cloud service maintained by a commercial provider. One such provider is Autodesk, Inc. which makes software for the architecture, engineering, construction and manufacturing industries.

Figure 3:
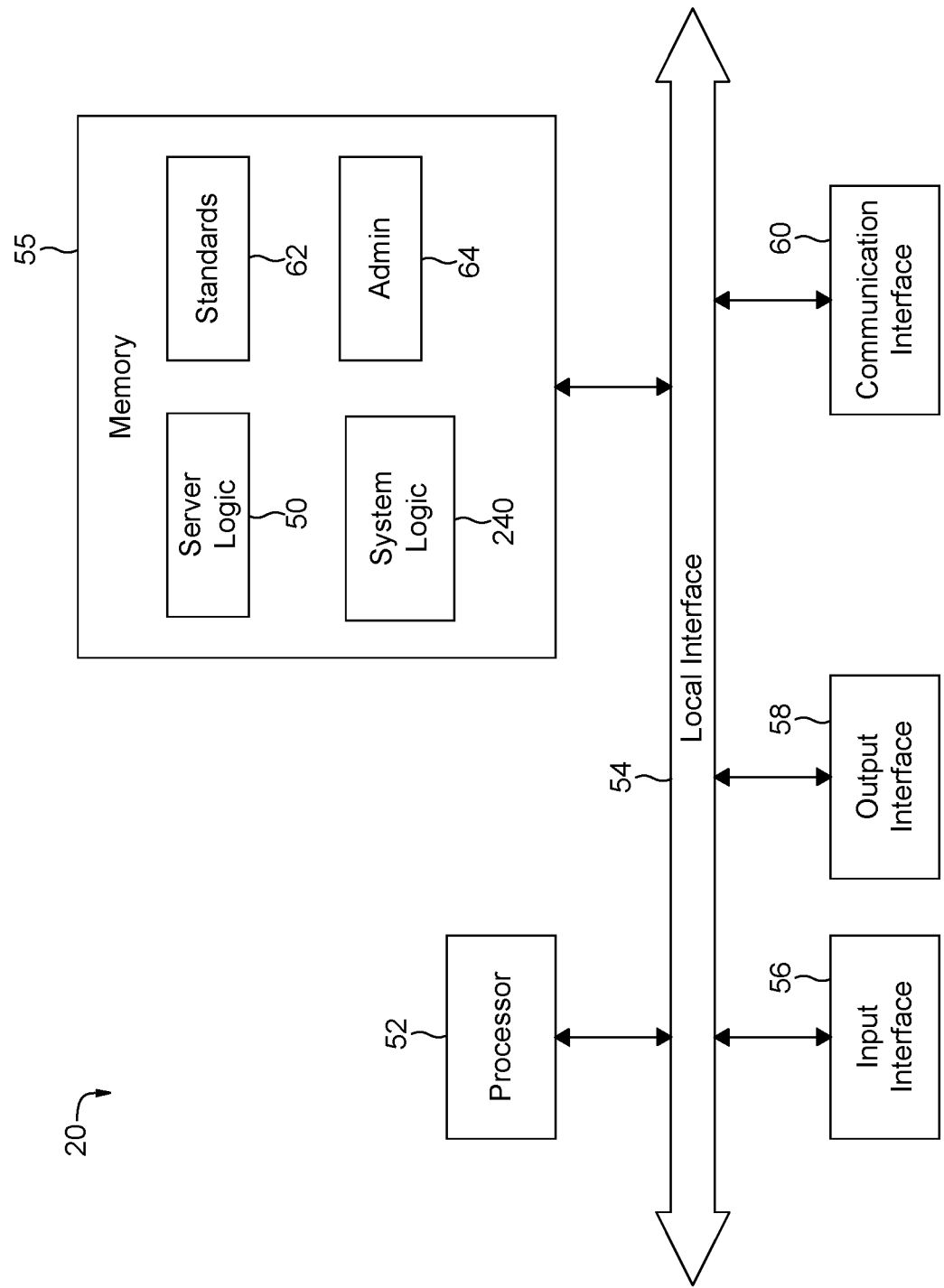
FIG. 3 is a block diagram illustrating an embodiment of the web server from FIG. 2.

FIG. 3 depicts an embodiment of the web server 20. Web server 20 provides the mechanism for the users 25 to interact with the system 15. As shown by FIG. 3, the web server 20 includes logic 50, referred to herein as "server logic," for generally controlling the operation of the web server 20, as will be described in more detail hereafter, including communicating with the first server 35 and the second server 40 and providing an interface for users 25. The server logic 50 can be implemented in software, hardware, firmware or any combination thereof. In the web server 20 illustrated by FIG. 3, the server logic 50 is implemented in software and stored in memory 55 of the server 20. Note that the server logic 50, when implemented in software, can be stored and transported on any computer-readable medium for use by or in connection with an instruction execution apparatus that can fetch and execute instructions.

The web server 20 depicted by FIG. 3 includes at least one conventional processor 52, which includes processing hardware for executing instructions stored in memory 55. As an example, the processor 52 may include a central processing unit (CPU) or a digital signal processor (DSP). The processor 52 communicates to and drives the other elements within the web server 20 via a local interface 54, which can include at least one bus. The processor 52 also directs communications between the other components of system 15, as will described in more detail hereafter. Furthermore, an input interface 56, for example, a keypad, keyboard or a mouse, can be used to input data from a user of the web server 20, and an output interface 56, for example, a printer, monitor, liquid crystal display (LCD), or other display apparatus, can be used to output data to the user of the web server 20. Further, a communication interface 60 may be used to exchange data with other components of system 15 (FIG. 2).

Referring again to FIG. 3, web server 20 hosts the standards site 62 with which the users 25 interface when utilizing system 15. The standards site 62 has all of the standards developed for use in system 15, which will be described in more detail hereafter. In an additional embodiment with reference to a construction application, the web server 20 hosts the administrative site 64. In this embodiment, the administrative site 64 allows administrators to upload new architectural drawings, control projects and revisions, manage new projects, and assign permissions to users, as will be described in more detail hereafter.

Figure 4:
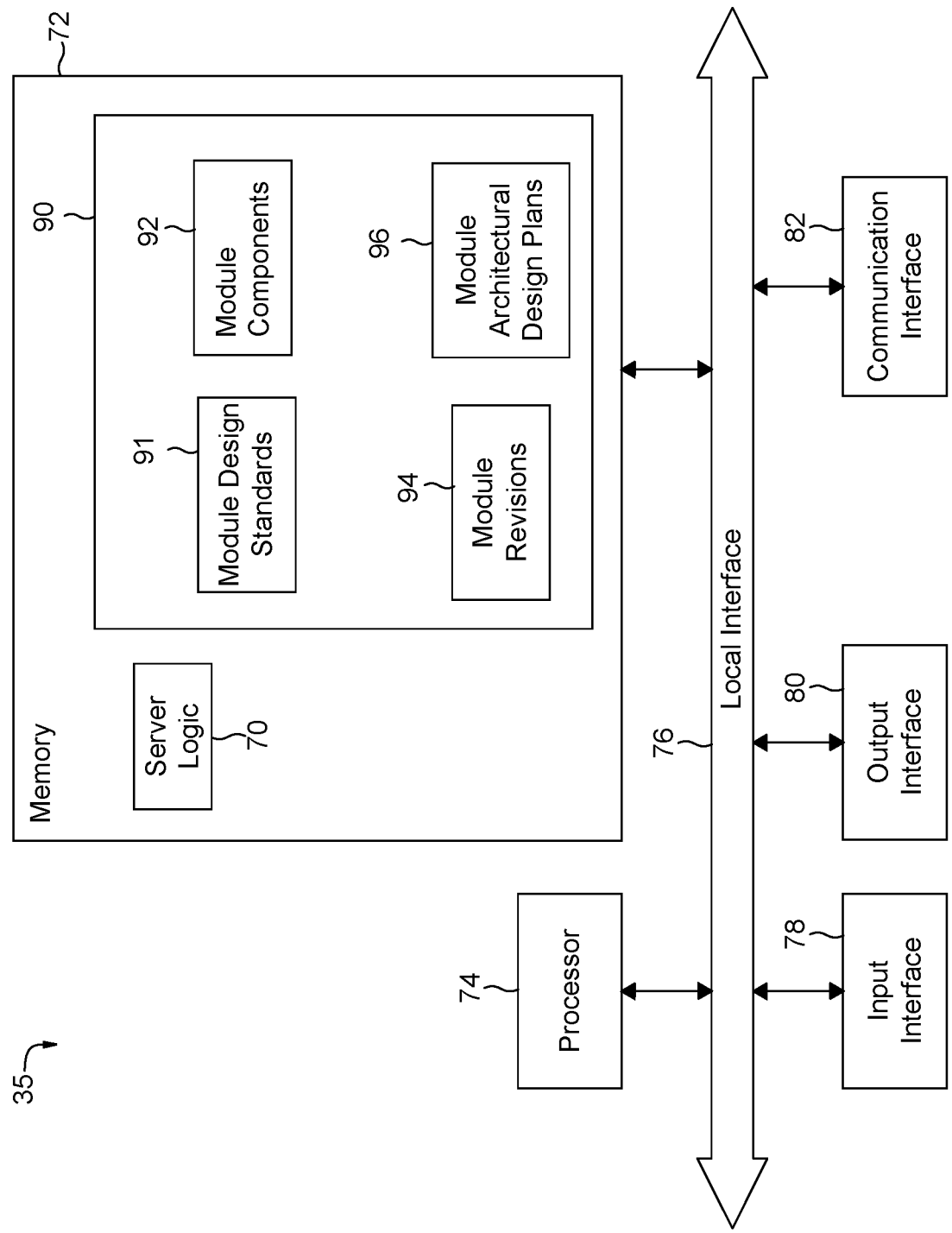
FIG. 4 is a block diagram illustrating an embodiment of a first server from FIG. 2.

FIG. 4 depicts an embodiment of a first server 35. The first server 35 can be an electronically searchable database, as will be explained in more detail hereafter. As shown by FIG. 4, the first server 35 includes logic 70, referred to herein as "first server logic," for generally controlling the operation of the first server 35, as will be described in more detail hereafter, including communicating with the web server 20. The logic 70 can be implemented in software, hardware, firmware or any combination thereof. In the first server 35 illustrated by FIG. 4, the server logic 70 is implemented in software and stored in memory 72 of the first server 35. Note that the server logic 70, when implemented in software, can be stored and transported on any computer-readable medium for use by or in connection with an instruction execution apparatus that can fetch and execute instructions.

The first server 35 depicted by FIG. 4 includes at least one conventional processor 74, which includes processing hardware for executing instructions stored in memory 72. As an example, the processor 74 may include a central processing unit (CPU) or a digital signal processor (DSP). The processor 74 communicates to and drives the other elements within the first server 35 via a local interface 76, which can include at least one bus. Furthermore, an input interface 78, for example, a keypad, keyboard or a mouse, can be used to input data from a user of the first server 35, and an output interface 80, for example, a printer, monitor, liquid crystal display (LCD), or other display apparatus, can be used to output data to the user of the first server 35. Further, a communication interface 82 may be used to exchange data with other components of system 15.

Referring again to FIG. 4, memory 72 of first server 35 includes a module design database 90 storing module design standards 91 for each of a plurality of prefabricated building modules 206. Module design standards for other industries are possible in other embodiments. In this embodiment, each module 206 has a base module design standard that includes a detailed design standard for the module 206 and for every component included within the module. For instance, a module design standard for a bathroom includes a design standard for each mirror, faucet, electrical socket, etc. included in the module 206. Such standards may further include, for example, specifications regarding the size and layout of each module 206 and the components within the module 206. In an additional embodiment, memory 72 further includes a database of module architectural design plans 96 for each of the modules 206 and each component 208 within the modules 206. In one embodiment, the module architectural design plan is created and stored (possibly as a file) in the design plan database 96 by the administrator. The design plan database 96 is made available to a user 25 through the web server 20, for instance through an Internet connection. In one embodiment, the module architectural design plan is modeled in an .rvt file (i.e., Autodesk Revit). A three dimensional .dwg file (i.e., an AutoCAD file) is exported out of the Revit file and then imported back into a Revit family (.rfa file). Both the Revit family (.rfa) and AutoCAD (.dwg) files are available for download by the user 25 from the web server 20.

Referring again to FIG. 4, the module design database 90 further includes a database of the descriptions of the module components 92. These descriptions include, in one embodiment, component manufacturer data, distributor data, cost data, installation data, maintenance data, specification date, parts data and user data. As will be discussed in more detail hereafter, the descriptions of the module components database 92 may be accessed by all users 25 to ensure uniformity and quality of the components used and consistency in the choice of component manufactures. In an additional embodiment described in more detail hereafter, the information included in the module components database 92 may be used to provide cost and durability analysis.

Figure 5:
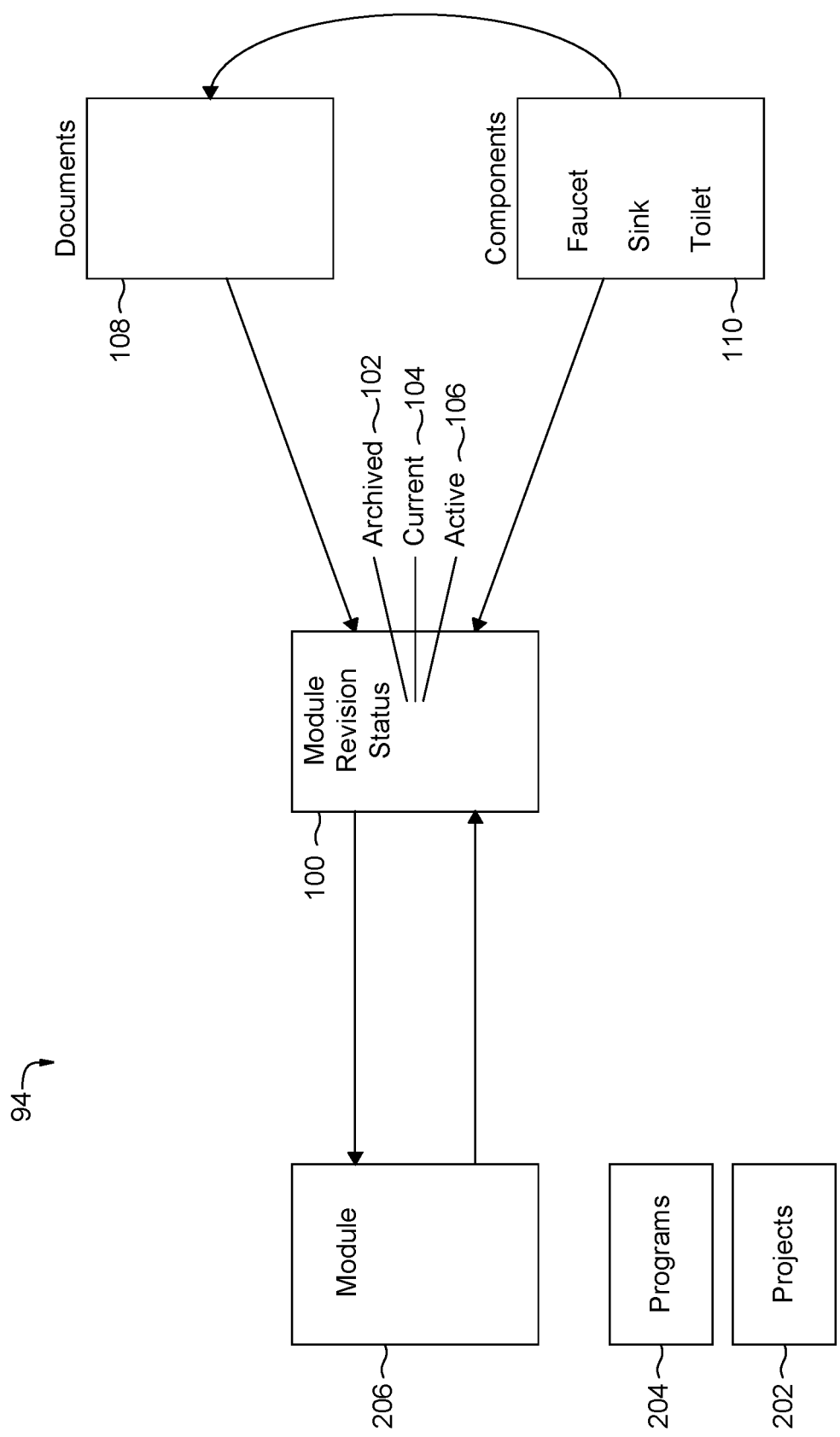
FIG. 5 is a block diagram illustrating an embodiment of a revisions database.

As illustrated in FIG. 4, memory 72 of the first database 35 further includes a module revision database 94. The organization and function of the modular revision database 94 is further exemplified in FIG. 5. The purpose of the module revision database 94 is to continuously track and update any changes made to the design of the components 208 included in a prefabricated module 206. The design revisions are then made available to all users 25 of system 15 in which the components 208 and modules 206 are used, regardless of the project type 202 or program 204 utilized by the user 25. As a result, any changes to the modular components 208 are uniformly incorporated into any applicable production project. Referring to FIG. 5, the revision database 94 includes a modular revision status indicator 100. In this embodiment, a modular revision may be classified as archived 102 (no longer in use), current 104 (in use but not the most current revision) and active 106 (most current). This database organization allows documents associated with older or currently unused modular designs to be available to assist with improvements, as will be described in more detail herein.

As illustrated in FIG. 5, each module 206 has a plurality of associated documents. Such documents may include, for example, architectural drawings related to the module 206 and the components 208 within the module 206. Each of the documents are uploaded by the administrator using the administrative site 64 and stored in the documents filed portion 108 of the modular revisions database 94, for instance as a Revitt file. In an embodiment, an architectural drawing associated with a faucet is stored in the components database 110. When updates or revisions are made to this file, a new entry is made in the documents portion 108 of the database 94. Additionally, the modular revisions status field 100 is updated to indicate that the current document is current 104.

Figure 6:
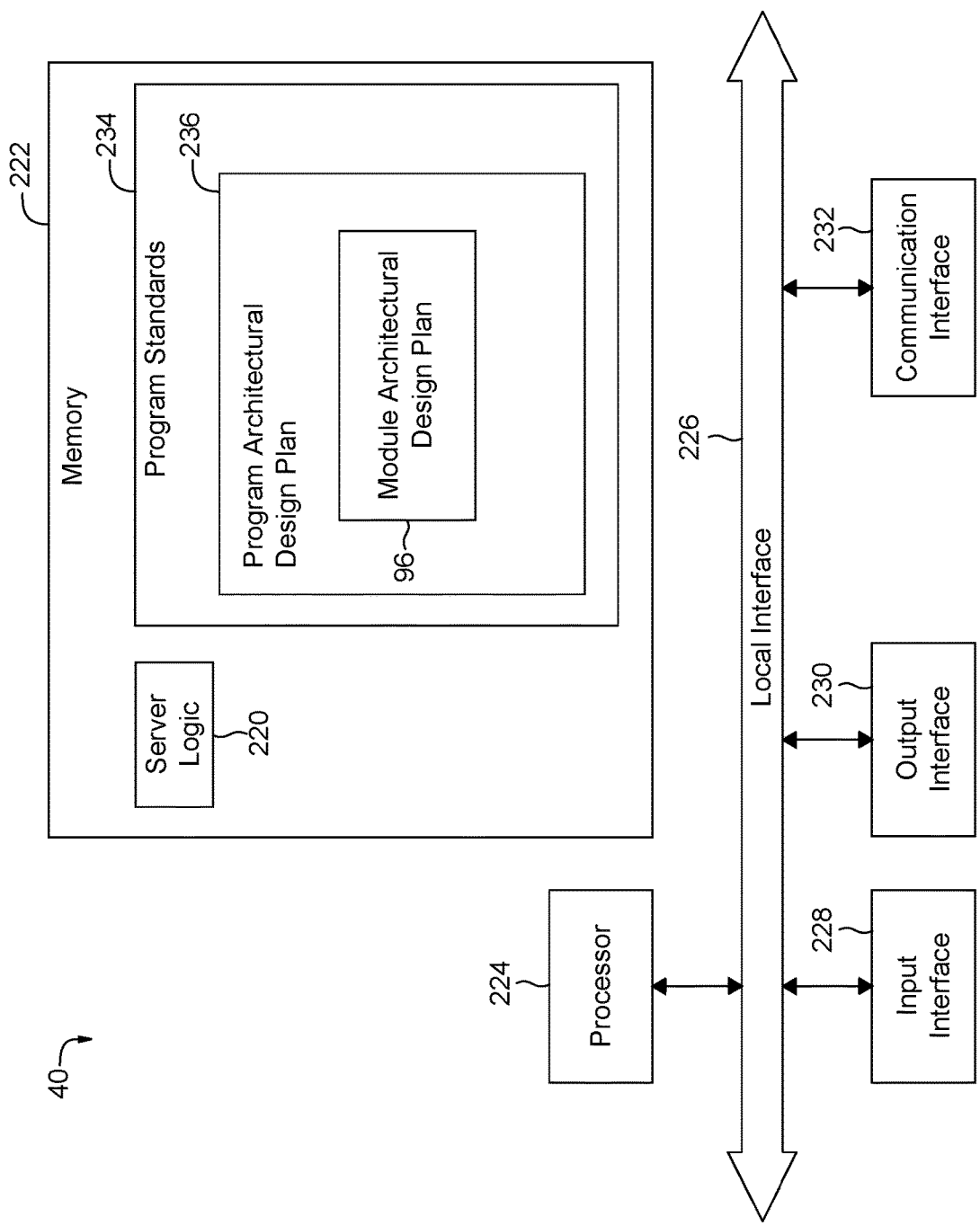
FIG. 6 is a block diagram illustrating an embodiment of a second server from FIG. 2.

FIG. 6 depicts an embodiment of a second server 40. The second server 40 can be an electronically searchable database, as will be explained in more detail hereafter. As shown by FIG. 6, the second server 40 includes logic 220, referred to herein as "second server logic," for generally controlling the operation of the second server 40, as will be described in more detail hereafter, including communicating with the web server 20. The logic 220 can be implemented in software, hardware, firmware or any combination thereof. In the second server 40 illustrated by FIG. 6, the server logic 220 is implemented in software and stored in memory 222 of the second server 40. Note that the server logic 222, when implemented in software, can be stored and transported on any computer-readable medium for use by or in connection with an instruction execution apparatus that can fetch and execute instructions.

The second server 40 depicted by FIG. 6 includes at least one conventional processor 224, which includes processing hardware for executing instructions stored in memory 222. As an example, the processor 224 may include a central processing unit (CPU) or a digital signal processor (DSP). The processor 224 communicates to and drives the other elements within the second server 40 via a local interface 226, which can include at least one bus. Furthermore, an input interface 228, for example, a keypad, keyboard or a mouse, can be used to input data from a user of the second server 40, and an output interface 230, for example, a printer, monitor, liquid crystal display (LCD), or other display apparatus, can be used to output data to the user of the second server 40. Further, a communication interface 232 may be used to exchange data with other components of system 15 (FIG. 2).

Referring again to FIG. 6, memory 222 of second server 40 includes a database of program standards 234 for each of a plurality of programs into which one or more of the prefabricated building modules 206 can be included. Such standards 234 include, for example, program architectural design plans 236 including at least one of the module architectural design plans 96 of the prefabricated building modules 206 stored in the first server 35. In this embodiment, each program 204 has a base design plan that includes a detailed architectural design plan for the program 204 and for every module 206 and component 208 included within the program 204. In one embodiment, the standards 234 for each program 204 of a project 202 are established by the administrator using the administrative site 64 and may include design elements for each project as well as governmental standards.

Referring again to FIG. 2, system 15 further includes logic 240, referred to herein as "system logic," for generally controlling the operation of the system 15 such as how the system 15 implements certain file creation mechanisms. In one embodiment, the system logic 240 can be embodied on a computer readable medium (CRM) and include processor readable instructions that, when executed by the processor 52 (FIG. 3), control the operation of the system 15 and the implementation of the file creation mechanisms. The system logic 240 can be implemented in software, hardware, firmware or any combination thereof. As used herein, the CRM of the system logic 240 is a medium capable of storing data in a format readable by a mechanical device. Examples of CRM for the system logic 240 include, but are not limited to, magnetic media such as magnetic disks, cards, tapes, and drums, optical disks and barcodes and magnetic ink characters.

Figure 7:
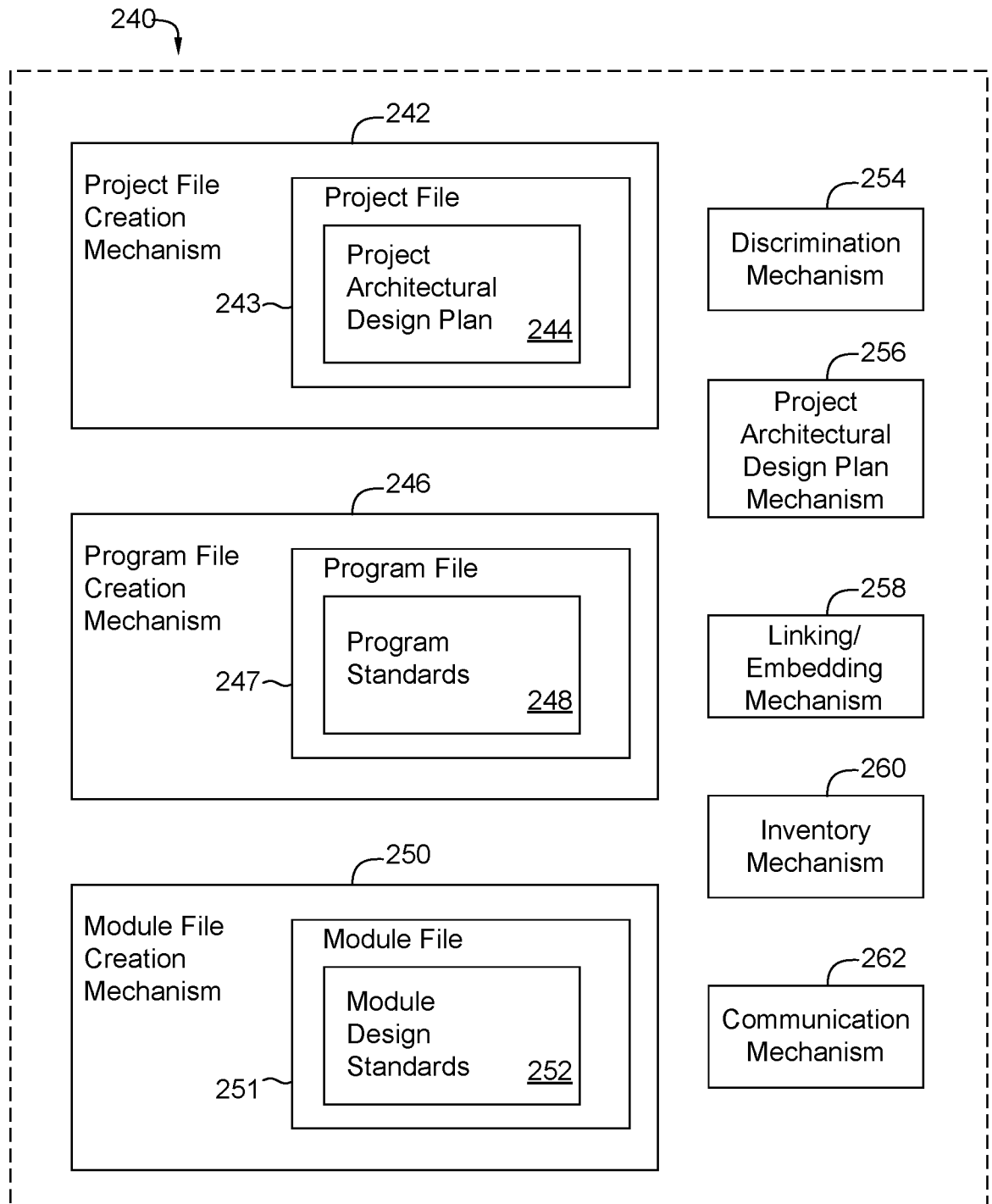
FIG. 7 is a block diagram illustrating an embodiment of system logic.

As illustrated in FIG. 7, the system logic 240 includes a plurality of file creation mechanisms which implement files. In one embodiment, system logic 240 includes a project file creation mechanism 242 which creates a project file 243 upon request by a user 25. In one embodiment, the project file 243 is associated with a project 202 and includes a project architectural design plan 244. The system logic 240 further includes a program file creation mechanism 246 with a program file 247 including program standards 248 for one or more module specifications 208 included in the project 202. The program standards 248 may include, for example, the width of the halls, the number of windows, etc. that are included with a program of a specific project 202. The program standards 248 are established by the administrator using the administrative site 64. As a result, a user 25 of system 15 may access the program standards 248 and determine the exact specifications for the relevant project 202. The creation and utilization of such program standards 248 ensures uniformity in construction across all programs 204 by such standardization.

Referring again to FIG. 7, the system logic 240 also contains processor readable instructions which, when executed by the processor 52, implements a module creation file mechanism 250 which creates a module file 251. The module file 251 includes module design standards 252 for one or more of the prefabricated building modules 206 that are to be incorporated into the project 202. The module design standards 252 may include, for example, the length and width of a bathroom, etc. The module design standards 252 are established by the administrator using the administrative site 64. As a result, a user 25 of system 15 may access the module design standards 252 and determine the exact specifications for the relevant module 206. The creation and utilization of such module design standards 252 ensures uniformity in construction across all modules 206, regardless of which project 202 and program 204 such modules 206 are incorporated.

In an additional embodiment, FIG. 7 illustrates that the system logic 240 also includes processor readable instructions which, when executed by the processor 52, implements a discrimination mechanism 254 that determines what program standards 234 from the second server 40 and module design standards 91 from the first server 35 are included in the program file 247. Additionally, the system logic 240 also includes processor readable instructions which, when executed by the processor 52, implements a project architectural design plan mechanism 256 for visually displaying a project architectural design plan of the project architectural design file 244 incorporating the module architectural design plans 96 of one or more of the prefabricated building modules 206 that are to be incorporated into the construction project. Referring again to FIG. 7, the processor 52 executes processor readable instructions to implement a linking or embedding mechanism 258 for linking or embedding the descriptions of components 208, from the module components database 92, of the one or more of the prefabricated building modules 206, to the project architectural design plan 244. In addition, the processor 52 executes processor readable instructions to implement an inventorying mechanism 260 for cataloging the prefabricated building module components 208 represented in the project architectural design plan file. Further, the processor 52 executes processor readable instructions to implement a communication mechanism 262 to enable a user 25 to communicate and/or share information regarding a project 202 with other users 25. In one embodiment, the communication mechanism 262 can send a message to a user 25 that either notifies the user 25 there is information in the system 15 for the user 25 to review or provides the user 25 with a message that includes the information (or a link to the information) for review by the user 25. In one embodiment, the message can be an email or text message to the user, but other types of messages may be used in other embodiments.

Figure 8:
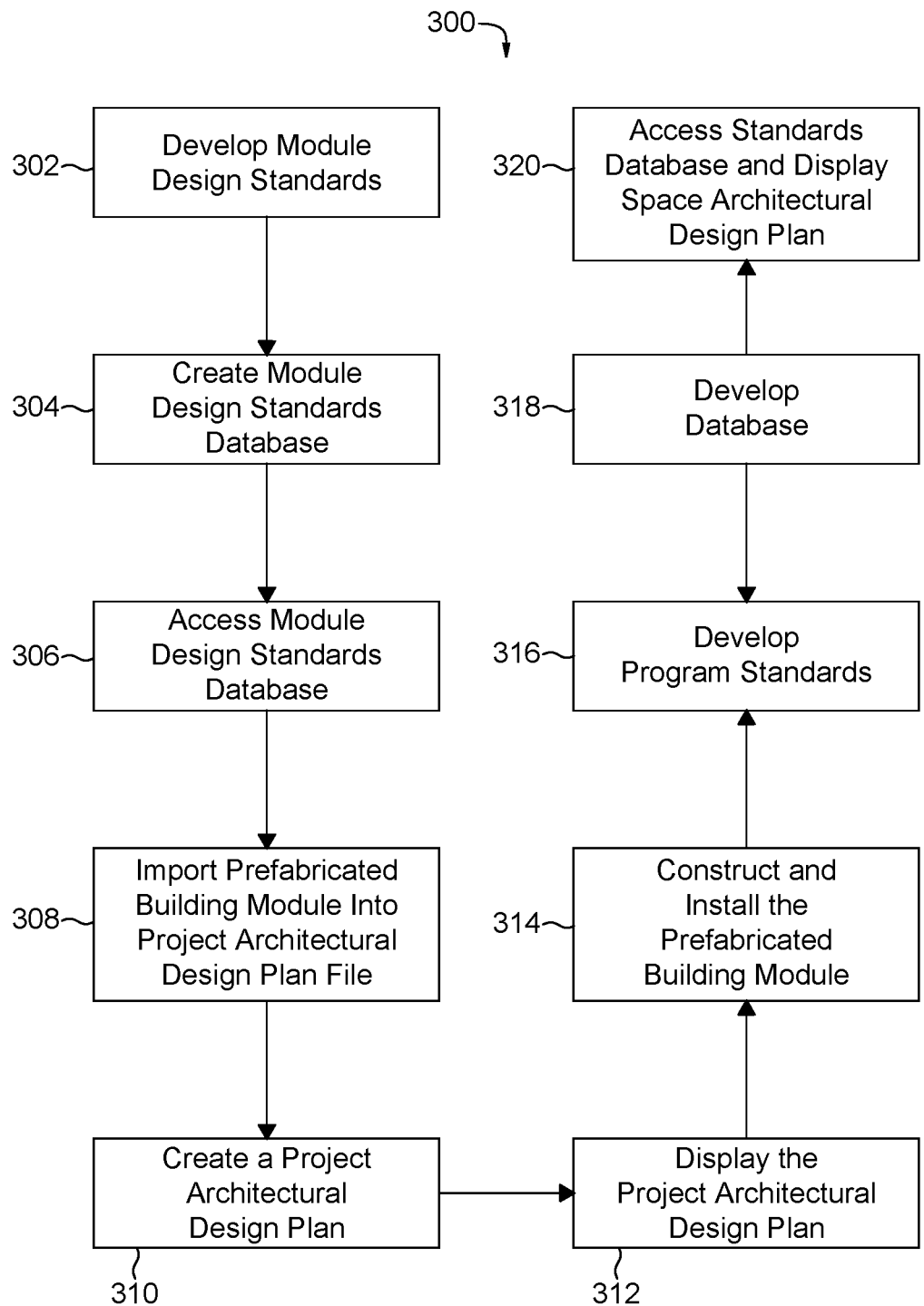
FIG. 8 is a flow diagram illustrating an embodiment of a design standard implementation system.

FIG. 8 depicts a design standards implementation method 300 in accordance with an embodiment of the present disclosure. In step 302, module design standards 91 are developed for a plurality of prefabricated building modules 206. The prefabricated building modules may include, for example, bathrooms, hospital room headwalls, hospital room foot walls, overhead racks, and exterior panels. In this embodiment, the module design standards 91 include, for each prefabricated building module of the plurality of prefabricated building modules 206, a module architectural design plan 96 and descriptions of components of the prefabricated building module from module components database 92. In one embodiment, the descriptions of components included in module components database 92 include, but are not limited to, component data such as manufacturer data, distributor data, cost data, installation data, facility data, project data, maintenance data, specifications data, parts data and user data. In certain embodiments, the module component descriptions in the module components database 92 are linked with the project architectural design plan 244 through the linking mechanism 258. Referring again to FIG. 8, step 304 includes creating a module design database 90 by electronically storing the module design standards 91 on a computer system including a processor, a computer readable medium and an interface. In this embodiment, the computer system can include the first server 35. As described previously, the module architectural design plans 96 and descriptions of components of the prefabricated building module in module components database 92 are provided by the administrator using the administrative site 64 and uploaded and stored in the first database 35. Users 25 may access a link to these databases 92 and 96 via the web server 20, for instance through an Internet connection. As a result, the large files 92 and 96 are not stored on the web server 20.

As illustrated in FIG. 8, step 306 of the method 300 includes accessing the module design database 90 over a network. As described previously, the module architectural design plans 96 and descriptions of components of the prefabricated building module 92 are provided by the administrator using the administrative site 64 and uploaded and stored in the first database 35. Users 25 may access a link to these databases 92 and 96 via the web server 20, for instance through an Internet connection. As a result, the large files 92 and 96 are not stored on the web server 20. The user 25 may then export from the module design database 90 a prefabricated building module file 251 including the module design standards 91 for a first prefabricated building module of the plurality of prefabricated building modules 206. In step 308, the prefabricated building module file 251 for the first prefabricated building module 206 is imported into a project architectural design plan 244. At step 310, the processor 52 creates a project architectural design plan based upon the project file 243 and the prefabricated building module file 251 (FIG. 7). Next, a project architectural design plan 244 is created and displayed, where the project architectural design plan 244 incorporates and illustrates the module architectural design plan of the first prefabricated building module 206 (step 312). Next, as illustrated in step 314, the first prefabricated building module 206 is manufactured and installed according to the project architectural design plan 244 of step 312.

In an additional embodiment, program standards may be developed for each project 202 that utilizes one or more of the prefabricated modules 206. In this embodiment, the program standards 234 include a program architectural design plan 236 which incorporates at least one of the module architectural design plans 96 (step 316). In step 318, the program standards database 234 is stored in the second server 40 and may accessed by the user through the web server 20, for instance through an Internet access. A user 25 may access the program standards database 234 and display the program architectural design plan 236, including at least one module architectural design plan 96 (step 320). The project may include, in one embodiment, hospital patient rooms, hospital examination rooms, hospital waiting rooms, and hospital post-anesthesia care unit rooms.

In use, a user 25 may utilize system 15 to create a project architectural design plan for a particular construction project. The user 25 logs onto the system 15 through web server 20. Through the administrative portion 64, each user 25 is associated with a particular project 202. Each project 202 is associated with a certain number of programs 204 and modules 206. For instance, in one embodiment, a user 25 will determine that a particular hospital building project will require the construction of an intensive care unit (ICU). The user 25 will then determine that the ICU will contain a certain number of bathroom, hospital room and headwall modules. Each module, through system 15, is assigned a specific number of components. The module design standards 91 for the module 206 can be extracted and a project architectural design plan 244 is created and displayed for the user 25.

The method 300 described above may be utilized to track inventory, compliance with building module and component standards and tracking maintenance of components. The administrator using the administrative site 64 provides component, module, program and project standards which are used in every project 202 utilizing system 15. The use of uniform components ensures that a component is standardized across every module 206, program 204 and project 202 in which it is incorporated. For example, each bathroom module constructed through the use of system 15 can incorporate the same sink components, i.e., the same pipes, fitting, faucets, etc. As discussed previously with reference to FIG. 5, each module 206 has a plurality of associated documents. Such documents may include, for example, architectural drawings related to the module 206 and the components 208 within the module 206. Each of the documents are uploaded by the administrator using the administrative site 64 (FIG. 2) and stored in the documents filed portion 108 of the modular revisions database 94. In an embodiment, an architectural drawing associated with a faucet is stored in the components database 104. System 15 may generate and visually display these documents. In one embodiment, the web server 20 compile a report directed to an inventory of the module components 208 used in a particular project 202. The inventory may be created by accessing the project architectural design plan file 244 containing the imported prefabricated building module file 252.

Figure 9:
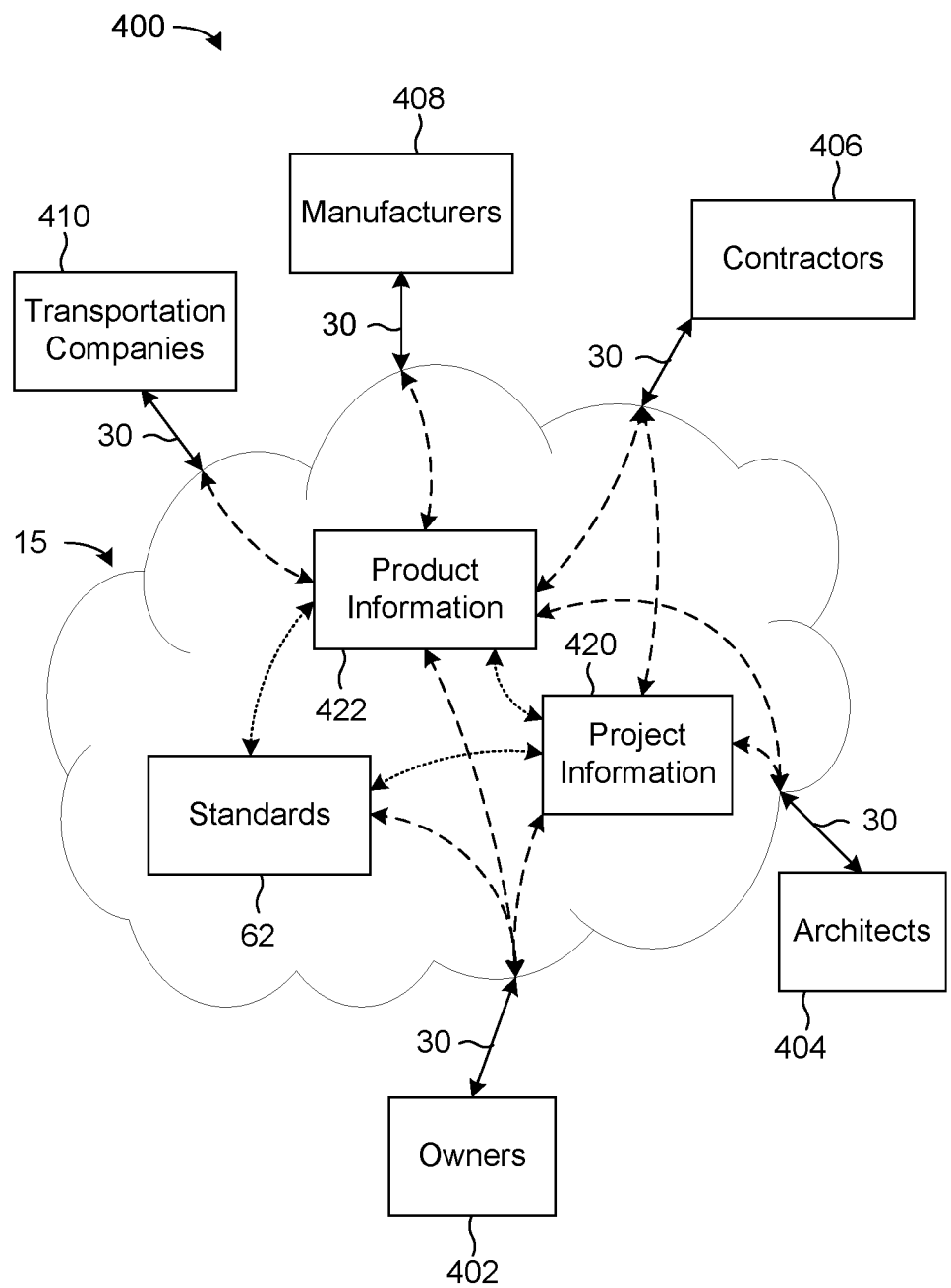
FIG. 9 is a block diagram illustrating an embodiment of an ecosystem associated with the building of a structure based on the system from FIG. 2.

In another embodiment as shown in FIG. 9, the system 15 can be used to provide a marketplace or ecosystem 400 for the design, manufacturing and construction (DMC) of structures. The ecosystem 400 can be supported by cloud-based software modules, as previously described herein, incorporated within system 15. The ecosystem 400 enables collaboration and commerce between the participants (or parties), some of which are identified below, associated with the process of building a structure from start (e.g., the design phase) to finish (e.g., the construction phase).

The system 15 can include the standards site 62, project information 420 and product information 422. The standards site 62, project information 420 and product information 422 stored in the system 15 supports collaboration and commerce between the participants of the ecosystem 400 by enabling the participants to work from common information (i.e., each participant obtains the same information on a standard, project or product). As shown in FIG. 9, the standards site 62 can provide information regarding standards that is included and/or incorporated in project information 420 and product information 422. In addition, product information 422 can provide information on products (which may also include standard information from standards site 62) that is included with and/or incorporated into project information 420.

As previously stated, the ecosystem 400 can be used to support a project 202 (e.g., the building of a structure) that involves multiple participants. The information regarding the project 202 can be stored in project information 420 and accessed, as needed, by one or more participants involved with the project 202. The design standards stored by standards site 62 can have varying levels of details and can include information that defines and/or describes projects 202 stored in project information 420 and/or products stored in product information 422. In an embodiment, a project 202 can correspond to the building of a finished item made from products. Products can include programs or assemblies 204 (e.g., complex items made from modules or sub-assemblies 206 and components 208), modules or sub-assemblies 206 (e.g., a portion of a program or assembly 204 made from components 208), components 208 (e.g., basic items used for programs or assemblies 204 or modules or sub-assemblies 206) and/or raw materials (e.g., items or materials used to make components 208) associated with the structure.

In the embodiment shown in FIG. 9, the participants that can interact with system 15 can include owners 402, architects 404, contractors 406, manufacturers 408 and/or transportation companies 410. While the embodiment of FIG. 9 shows five participants interacting with the system 15, more or less participants can interact with the system 15 in other embodiments. In addition, the types of participants that interact with the system 15 may be different in other embodiments based on the projects 202 included within the system 15.

In an embodiment, the owners 402 can provide the projects 202 (stored in project information 420) and the corresponding standards (stored in standards site 62) for the projects 202 that are stored and tracked by the system 15. As shown in FIG. 9, owners 402 can access the system 15 via network 30 and then access the standards site 62, the project information 420 and the product information 422. In addition, the owners 402 can use the system 15 to approve or disapprove of project design plans (stored in project information 420) and/or product design plans (stored in product information 422). An owner 402 may disapprove of a design plan (either project or product) from an architect 404 or manufacturer 408 as not conforming to documented standards (in standards site 62) that may be applicable for the project or product or for other reasons. If the owner 402 approves a design plan for a project or product from an architect 404 or manufacturer 408, the system 15 can then store the approved design plan in project information 420 and/or product information 422.

Architects 404 can be contacted by owners 402 using the system 15 (e.g., via the communication mechanism 262) to engage the architects 404 to generate a design plan for the project 202 based on one or more standards (stored in standards site 62) established by the owner 402. As shown in FIG. 9, architects 404 can access the system 15 via network 30 and then access the project information 420 and the product information 422. In other embodiments, the architects 404 can also access the standards site 62 via the system 15. When generating a design plan for a project 202, the architect 404 can review previously approved design plans for other projects that are stored in project information 420. If one of the previously approved design plans has some similarity to the current project 202, the architect 404 may use the previously approved design plan as a starting point for the preparation of the design plan for the current project 202. The architect 404 can then make additions, deletions and/or substitutions to the previously approved design plan when generating the design plan for the project 202.

In addition, the architect 404 may review product information 422 for information on one or more products that may be included in the design plan for the project 202. If the architect 404 is able to identify one or more products for inclusion in the design plan for the project 202, the architect can then incorporate the previously approved design plans stored in product information 422 for the identified product(s) into the design plan for the current project 202. Once the architect 404 has completed a design plan for a project 202, the architect 404 can then provide the design plan for the project to the owner 402 via the system 15 to obtain approval of the design plan for the project 202 and a determination that the design plan for the project 202 conforms to the applicable standards (stored in standards site 62) for the project 202. Upon approval of a design plan for the project 202, the design plan for the project can be stored in project information 420. In an embodiment, an approved design plan for the project 202 (stored in project information 420) can be linked to the corresponding standards 62 (stored in standards site 62) for the project 202 such that the scope of a project 202 can be defined by the corresponding standards 62 for the project 202. As described above, the standards (stored in standards site 62) for a project 202 can be embedded into the design plan for the project 202 in an embodiment to enable an participant viewing the design plan of the project 202 to obtain (via the system 15) the corresponding information regarding the standards 62 for the project 202 without having to access the standards site 62 directly.

Contractors 406 can be contacted by owners 402 using the system 15 to engage the contractors 406 to build the structure (or other item) according to the design plan for the project 202 prepared by the architect 404 (and approved by the owner 402). As shown in FIG. 9, contractors 406 can access the system 15 via network 30 and then access the project information 420 and the product information 422 to obtain the necessary information on the project 202. In other embodiments, the contractors 406 can also access the standards site 62 via the system 15.

Manufacturers 408 can be contacted by architects 404 using the system 15 to engage the manufacturers 408 to generate a design plan for one or more products based on one or more standards (stored in standards site 62) established by the owner 402. As shown in FIG. 9, manufacturers 408 can access the system 15 via network 30 and then access the product information 422. In other embodiments, the manufacturer 408 can also access the standards site 62 the project information 420 via the system 15. When generating a design plan for a product, the manufacturer 408 can review previously approved design plans for other products that are stored in product information 422. If one of the previously approved design plans has some similarity to the products being used in the design plan for the project 202, the manufacturer 408 may use the previously approved design plan as a starting point for the preparation of the design plan for the current product(s). The manufacturer 408 can then make additions, deletions and/or substitutions to the previously approved design plan when generating the design plan for the product(s). Once the manufacturer 408 has completed a design plan for a product, the manufacturer 408 can then provide the product design plan to the architect 404 and/or owner 402 via the system 15 to obtain approval of the product design plan and a determination that the product design plan conforms to the applicable standards (stored in standards site 62) for the product. Upon approval of a product design plan, the product design plan can be stored in product information 422 and included in the design plan for the project 202.

In an embodiment, a manufacturer 408 may be engaged by the contractor 406 via the system 15 to build a product for the project 202 according to the design plan for the product stored in product information 422. The product design plan used by the manufacturer 408 to build the product can include instructions on building the product and may have been created by either by a participant associated with the project 202 (e.g., the architect 404 or manufacturer 408) or, if the product design plan was selected from product information 422 by the architect 404, from a participant associated with another project. In other words, a manufacturer 408 is able to use the system 15 to obtain information to build a product according to a product design plan even if the manufacturer 408 did not create the product design plan.

Transportation companies (or storage companies) 410 can be contacted by contractors 406 and/or manufacturers 408 using the system 15 to engage the transportation companies 410 to transport products made by manufacturers 408 to other manufacturers 408 (if the product is needed by the other manufacturer 408 to make another product) or to the contractor 406 (if the product is to be incorporated into the project by the contractor 406). As shown in FIG. 9, transportation companies 410 can access the system 15 via network 30 and then access the product information 422. In other embodiments, the transportation companies 410 can also access the standards site 62 and the project information 420 via the system 15. The transportation companies 410 may access the product information about a product to determine the most appropriate way to transport the product to its destination. For example, exceptionally large products (e.g., a room or wing of a building) may require additional planning such as specialized equipment and/or permits in order to transport the product.

In addition, the system 15 can be used to invite participants to participate in a project 202. For example, a manufacturer 408 having experience making a particular product (as defined in product information 422) may be invited by an architect 404 or contractor 406 to participate in a project 202 that incorporates the product or a similar product into the design plan for the project 202. In another example, several manufacturers 408 may be invited by an architect 404 or contractor 406 to provide information about products that have approved design plans stored in product information 422 that the architect 404 may be considering for inclusion in a design plan for a project 202 or the contractor 406 may be considering for use in the project 202. The architect 404 or contractor 406 can then select the desired product(s) for the project 202 and work with the corresponding manufacturer(s) 408 to integrate the product(s) into either the design plan for the project 202 or the project itself.

For example, an owner 402 having a project 202 directed to the building of a structure can use the system 15 to identify and engage an architect 404 to develop a design plan for the project 202 (i.e., the structure) based on design standards (stored in standards site 62) established by the owner 402. In some embodiments, the architect 404 may be able to use some or all of a previously approved project design stored by the system 15 in project information 420 when developing a project design for the project 202. Often, the architect 404 cannot select an existing design plan from the project information 420 that completely conforms to the standards of the owner 402 but has to either make changes to an existing design plan or create a new design plan for the structure. When creating a new design plan (or making changes to an existing design plan) for the structure, the architect 404 can then select or require one or more products (which may include programs or assemblies 204, modules or sub-assemblies 206 and/or components 208) for inclusion in the design plan for the structure. If there is an existing design plan for a product (e.g., a room) stored in product information 422 that conforms to the specifications of the owner 402 for the structure, the architect 404 can incorporate the product, and its corresponding design plan, into the design plan for the structure by embedding a link into the design plan for the structure that is linked to the corresponding design plan for the product in the product information 422.

If the design plans for the products stored in product information 422 do not conform to the specifications for the structure set forth by the owner 402, the architect 404 can either create design plans for the required products for the structure that conforms to the specifications for the structure, engage a manufacturer 408 (using the system 15) to create conforming design plans for the products, or collaborate with one or more manufacturers 408 (using the system 15) to create design plans for the product(s). The architect 404 (or manufacturer 408) can design the product(s) needed for the structure in accordance with the corresponding design standards 62 established by the owner 402 and available via the system 15. The design standards 62 can include information about each product (or a portion of a product) needed for the structure such as the features or dimensions that have to be present in the product(s) for the structure.

In an embodiment, the product (i.e., the room or group of rooms) can include corresponding assemblies 204, sub-assembles 206 and/or components 208. If the architect 404 selects a design plan for the room (or group of rooms) that has a design plan stored in the product information 422, the architect 404 does not have to provide design plans for any assemblies 204, sub-assembles 206 and/or components 208 included in the room (or group of rooms) since the design plans for any assemblies 204, sub-assembles 206 and/or components 208 that form the room (or group of rooms) would be embedded into the design plan for the room (or group of rooms). In contrast, if the architect 404 (or manufacturer 408) has created an original design plan for the room (or group of rooms), the architect 404 (or manufacturer 408) has to either create design plans for each of the assemblies 204, sub-assemblies 206 and/or components 208 included in the room (or group of rooms) or embed existing designs plans for selected assemblies 204, sub-assembles 206 and/or components 208 stored in product information 422 into the design plan for the room (or group of rooms).

Once a design plan for the structure is completed, the architect 404 can provide a proposed project design to the owner 402 using the communication mechanism 262 of system 15 for the approval of the owner 402. When approved, the system 15 can store the project design for the structure with the embedded standards from the standards site 62. The project design for the structure stored by the system 15 can include embedded information on the products (e.g., assemblies 204, sub-assemblies 206, components 208, etc.) needed for the structure.

The architect 404 or owner 402 can use the system 15 (via communication mechanism 262) to share the project design and corresponding product designs and design standards with one or more contractors 406 to either receive proposals or bids from the contractor(s) 406 for building the structure or to enable a previously selected contractor 406 to start building the structure. The contractor 406 can use the system 15 in order to identify and/or communicate with one or more possible manufacturers 408 to build one or more product(s), such as room or a fixture for a room, needed for the structure. The contractor 406 can use the system 15 to provide the corresponding product design plans and design standards 62 associated with the product(s) to the manufacturers 408. After reviewing the product design plans and design standards for the product(s), interested manufacturers 408 may provide proposals or bids to the contractor 406 for manufacturing one or more products associated with the project 202. The contractor 406 can review the proposal or bid information from the manufacturers 408 to select one or more manufacturers 408 for the manufacturing of the products (e.g., the rooms and fixtures) of the structure.

The proposal and/or collaboration process can be repeated with other participants in the ecosystem 400 (e.g., a manufacturer 408 may identify and communicate with other manufacturers 408 regarding a component 208 needed for a sub-assembly 206) until design plans and corresponding standards are established down to the component level. Once a product (e.g., a room or fixture) has been manufactured, the manufacturer 408 and/or the contractor 406 can use the system 15 to identify and communicate with one or more transportation companies 410 to arrange for the transport of the room or fixture. The transportation companies 410 may be engaged to transport manufactured products between manufacturers 408 (e.g., the transportation of a fixture made by one manufacturer 408 to a second manufacturer 408 responsible for building a room) or between a manufacturer 408 and a contractor 406 (e.g., the transportation of a room made by a manufacturer 408 to the project site operated by the contractor 406). While not shown in FIG. 9, in some embodiments, the ecosystem 400 may also include participants that are raw material suppliers for the manufacturing of products. Contractors 406 and manufacturers 408 can use the system 15 to identify and communicate with raw material suppliers in order to obtain the necessary materials for building the products.

In addition, the standards in standards site 62 and/or the design plans for a project (stored in project information 420) or a product (stored in product information 422) can also include information such as a bill of materials needed for the manufacture of a project or product (e.g., an assembly, sub-assembly, etc.) and corresponding assembly instructions for making the project or product. The bill or material information and/or assembly information can then be shared through the ecosystem 400 by the participants associated with the process of building the structure such that each participant at each stage of the process knows the requirements for their portion of the project.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the scope of the following claims.

As a further example, variations of apparatus or process parameters (e.g., dimensions, configurations, components, process step order, etc.) may be made to further optimize the provided structures, devices and methods, as shown and described herein. The structures and devices, as well as the associated methods, described herein have many applications. Therefore, the disclosed subject matter should not be limited to any single embodiment described herein, but rather should be construed in breadth and scope in accordance with the appended claims.

What is claimed is:

1. A design, manufacturing and construction system for building structures, the system comprising:
   at least one server computer, the at least one server computer being accessible by a plurality of participants via a network, the at least one server computer comprising:
   at least one processor; and
   at least one memory, the at least one memory storing:
      first information including a plurality of standards, each standard of the plurality of standards defining requirements for one of a project or a product;
      second information including a plurality of product design plans for a plurality of products, each product design plan corresponds to a product and conforms to at least one standard of the plurality of standards for the corresponding product;
      third information including a plurality of project design plans, each project design plan of the plurality of project design plans corresponds to a project, incorporates at least one product design plan for at least one product and conforms to at least one standard of the plurality of standards for the corresponding project; and
   at least one computer readable medium encoded with processor readable instructions that, when executed by the at least one processor, cause the at least one processor to:
      create at least one new standard for a new project based on at least one input provided by a first participant of the plurality of participants, the new project being associated with building a structure;
      provide the at least one new standard to a second participant of the plurality of participants different from the first participant;
      create a design plan for the new project based on at least one input provided by the second participant, wherein the new project design plan is in conformance with the at least one new standard;
      provide the new project design plan to a third participant of the plurality of participants different from the second participant, the third participant being responsible for building the structure in accordance with the new project design plan;
      provide the at least one new standard to a fourth participant of the plurality of participants different from the third participant; and
      create a design plan for a new product based on at least one input provided by the fourth participant, wherein the new product design plan is incorporated into the new project design plan and in conformance with the at least one new standard.

2. The system of claim 1, wherein the at least one computer readable medium is further encoded with processor readable instructions that cause the at least one processor to:
   provide a draft design plan for the new project created by the second participant to the first participant; and
   store the draft design plan for the new project with the third information as the new project design plan upon approval of the draft design plan by the first participant.

3. The system of claim 1, wherein the at least one computer readable medium is further encoded with processor readable instructions that cause the at least one processor to:
   provide a draft design plan for the new product created by the fourth participant to at least one of the first participant or the second participant; and
   store the draft design plan for the new product with the second information as the new product design plan upon approval of the draft design plan by the at least one of the first participant or the second participant.

4. A design, manufacturing and construction system for building structures, the system comprising:
   at least one server computer, the at least one server computer being accessible by a plurality of participants via a network, the at least one server computer comprising:
   at least one processor; and
   at least one memory, the at least one memory storing:
      first information including a plurality of standards, each standard of the plurality of standards defining requirements for one of a project or a product;
      second information including a plurality of product design plans for a plurality of products, each product design plan corresponds to a product and conforms to at least one standard of the plurality of standards for the corresponding product;
      third information including a plurality of project design plans, each project design plan of the plurality of project design plans corresponds to a project, incorporates at least one product design plan for at least one product and conforms to at least one standard of the plurality of standards for the corresponding project; and
   at least one computer readable medium encoded with processor readable instructions that, when executed by the at least one processor, cause the at least one processor to:
      create at least one new standard for a new project based on at least one input provided by a first participant of the plurality of participants, the new project being associated with building a structure;
      provide the at least one new standard to a second participant of the plurality of participants different from the first participant;
      create a design plan for the new project based on at least one input provided by the second participant, wherein the new project design plan is in conformance with the at least one new standard;

incorporate a product design plan for a product from the second information into the new project design plan, wherein the product design plan incorporated into the new project design plan is in conformance with the at least one new standard; and provide the new project design plan to a third participant of the plurality of participants different from the second participant, the third participant being responsible for building the structure in accordance with the new project design plan.

5. The system of claim 4, wherein the at least one computer readable medium is further encoded with processor readable instructions that cause the at least one processor to display the second information to the second participant to permit the second participant to select the product design plan incorporated into the new project design plan.

6. The system of claim 4, wherein the at least one computer readable medium is further encoded with processor readable instructions that cause the at least one processor to provide the product design plan incorporated into the new project design plan to a fourth participant of the plurality of participants different from the third participant to permit the fourth participant to manufacture a product in accordance with the product design plan.

7. The system of claim 6, wherein the at least one computer readable medium is further encoded with processor readable instructions that cause the at least one processor to provide a message to a fifth participant of the plurality of participants to request the fifth participant transport the product manufactured by the fourth participant.

8. The system of claim 6, wherein the at least one computer readable medium is further encoded with processor readable instructions that cause the at least one processor to provide a message to a plurality of fifth participants of the plurality of participants to request each fifth participant of the plurality of fifth participants provide a proposal regarding transport of the product manufactured by the fourth participant.

9. The system of claim 8, wherein the at least one computer readable medium is further encoded with processor readable instructions that cause the at least one processor to provide the proposals from the plurality of fifth participants to the third participant to permit the third participant to select a fifth participant of the plurality of fifth participants to transport the manufactured product.

10. A method for facilitating a plurality of participants with design, manufacturing and construction of structures, the method comprising:

storing, by at least one server computer, information related to building a structure, the information comprising:

first information including a plurality of standards, each standard of the plurality of standards defining requirements for one of a project or a product;

second information including a plurality of product design plans for a plurality of products, each product design plan corresponds to a product and conforms to at least one standard of the plurality of standards for the corresponding product; and third information including a plurality of project design plans, each project design plan of the plurality of project design plans corresponds to a project, incorporates at least one product design plan for at least one product and conforms to at least one standard of the plurality of standards for the corresponding project;

creating, by the at least one server computer, at least one new standard for a new project based on at least one input provided to the at least one server computer by a first participant of the plurality of participants, the new project being associated with building a structure;

providing, by the at least one server computer, the at least one new standard and a message to a plurality of second participants of the plurality of participants different from the first participant, wherein the message requests each second participant of the plurality of second participants to provide a proposal regarding creation of a design plan for the new project;

providing, by the at least one server computer, the proposals from the plurality of second participants to the first participant to permit the first participant to select the second participant of the plurality of second participants to provide at least one input on the creation of the design plan for the new project;

creating, by the at least one server computer, a design plan for the new project based on the at least one input provided by the selected second participant to the at least one server computer, wherein the new project design plan is in conformance with the at least one new standard; and providing, by the at least one server computer, the new project design plan to a third participant of the plurality of participants different from the second participant, the third participant being responsible for building the structure in accordance with the new project design plan.

11. The method of claim 10, wherein the creating the design plan for the new project includes:

providing to the first participant, by the at least one server computer, a draft design plan for the new project created by the selected second participant; and storing, by the at least one server computer, the draft design plan for the new project with the third information as the new project design plan upon approval of the draft design plan by the first participant.

12. A method for facilitating a plurality of participants with design, manufacturing and construction of structures, the method comprising:

storing, by at least one server computer, information related to building a structure, the information comprising:

first information including a plurality of standards, each standard of the plurality of standards defining requirements for one of a project or a product;

second information including a plurality of product design plans for a plurality of products, each product design plan corresponds to a product and conforms to at least one standard of the plurality of standards for the corresponding product; and third information including a plurality of project design plans, each project design plan of the plurality of project design plans corresponds to a project, incorporates at least one product design plan for at least one product and conforms to at least one standard of the plurality of standards for the corresponding project:

creating, by the at least one server computer, at least one new standard for a new project based on at least one input provided to the at least one server computer by a first participant of the plurality of participants, the new project being associated with building a structure;

providing, by the at least one server computer, the at least one new standard to a second participant of the plurality of participants different from the first participant;

creating, by the at least one server computer, a design plan for the new project based on at least one input provided by the second participant to the at least one server computer, wherein the new project design plan is in conformance with the at least one new standard, wherein the creating the design plan for the new project includes incorporating, by the at least one server computer, a product design plan for a product from the second information into the new project design plan, wherein the product design plan incorporated into the new project design plan is in conformance with the at least one new standard; and providing, by the at least one server computer, the new project design plan to a third participant of the plurality of participants different from the second participant, the third participant being responsible for building the structure in accordance with the new project design plan.

13. The method of claim 12, wherein the creating the design plan for the new project includes displaying, by the at least one server computer, the second information to the second participant to permit the second participant to select the product design plan incorporated into the new project design plan.

14. The method of claim 12, further comprising providing, by the at least one server computer, the product design plan incorporated into the new project design plan to a fourth participant of the plurality of participants different from the third participant to permit the fourth participant to manufacture a product in accordance with the product design plan.

15. The method of claim 14, further comprising providing, by the at least one server computer, a message to a fifth participant of the plurality of participants to request the fifth participant to transport the product manufactured by the fourth participant.

16. A method for facilitating a plurality of participants with design, manufacturing and construction of structures, the method comprising:

storing, by at least one server computer, information related to building a structure, the information comprising:

first information including a plurality of standards, each standard of the plurality of standards defining requirements for one of a project or a product;

second information including a plurality of product design plans for a plurality of products, each product design plan corresponds to a product and conforms to at least one standard of the plurality of standards for the corresponding product; and third information including a plurality of project design plans, each project design plan of the plurality of project design plans corresponds to a project, incorporates at least one product design plan for at least one product and conforms to at least one standard of the plurality of standards for the corresponding project;

creating, by the at least one server computer, at least one new standard for a new project based on at least one input provided to the at least one server computer by a first participant of the plurality of participants, the new project being associated with building a structure;

providing, by the at least one server computer, the at least one new standard to a second participant of the plurality of participants different from the first participant;

creating, by the at least one server computer, a design plan for the new project based on at least one input provided by the second participant to the at least one server computer, wherein the new project design plan is in conformance with the at least one new standard;

providing, by the at least one server computer, the new project design plan to a third participant of the plurality of participants different from the second participant, the third participant being responsible for building the structure in accordance with the new project design plan;

providing, by the at least one server computer, the at least one new standard to a fourth participant of the plurality of participants different from the third participant; and creating, by the at least one server computer, a design plan for a new product based on at least one input provided to the at least one server computer by the fourth participant, wherein the new product design plan is incorporated into the new project design plan and is in conformance with the at least one new standard.

17. The method of claim 16, wherein the creating a design plan for a new product includes:

providing, by the at least one server computer, a draft design plan for the new product created by the fourth participant to at least one of the first participant or the second participant; and storing, by the at least one server computer, the draft design plan for the new product with the second information as the new product design plan upon approval of the draft design plan by the at least one of the first participant or the second participant.

* * * * *